United States Patent [19]

Melcher et al.

[11] Patent Number: 4,504,727

[45] Date of Patent: Mar. 12, 1985

[54] LASER DRILLING SYSTEM UTILIZING PHOTOACOUSTIC FEEDBACK

[75] Inventors: Robert L. Melcher, Mount Kisco; Sheree H. Wen, Mohegan Lake, both of N.Y.

[73] Assignee: International Business Machines Corporation, Armonk, N.Y.

[21] Appl. No.: 454,913

[22] Filed: Dec. 30, 1982

[51] Int. Cl.³ .............................................. B23K 27/00
[52] U.S. Cl. ....................... 219/121 LB; 219/121 LK; 219/121 LG
[58] Field of Search .................. 219/121 LA, 121 LB, 219/121 LC, 121 LD, 121 LG, 121 LN, 121 LK, 121 LL

[56] References Cited

U.S. PATENT DOCUMENTS 3,700,850 10/1972 Lumley et al. ................ 219/121 LJ
4,419,562 12/1983 Jon et al. ................... 219/121 LB X

OTHER PUBLICATIONS

H. E. Klauser, "Close-Loop Laser Control System", Feb. 1982, pp. 4691–4692, vol. 24, No. 9, in the IBM Technical Disclosure Bulletin.
C. E. Yeack, R. L. Melcher, H. E. Klauser, "Transient Photoacoustic Monitoring of Pulsed Laser Drilling", Dec. 1982, pp. 1043–1044, Applied Physics Letters 41, (11).

*Primary Examiner*—C. L. Albritton
*Attorney, Agent, or Firm*—Yen S. Yee; Graham S. Jones, II

[57] ABSTRACT

A laser drilling control system utilizing photoacoustic feedback is described. The control system provides an accurate monitoring of the laser drilling of a multilayered printed circuit board thereby allowing uniform drilling through layers of different optical and photoacoustic properties by both analyzing the photoacoustic feedback signals received, and adjusting optimally the laser parameters such as pulse duration, wavelength, energy, pulse repetition rate, and the number of pulses, for each successive layer. The system also provides an end point detection which prevents underdrilling overheating, and overdrilling of underlying layers and associated damages. According to another aspect of this invention, the control system can be used as a sensitive misregistration detector for aligning the laser beam to a selected drill site for subsequent drilling at the selected drill site.

16 Claims, 1 Drawing Figure

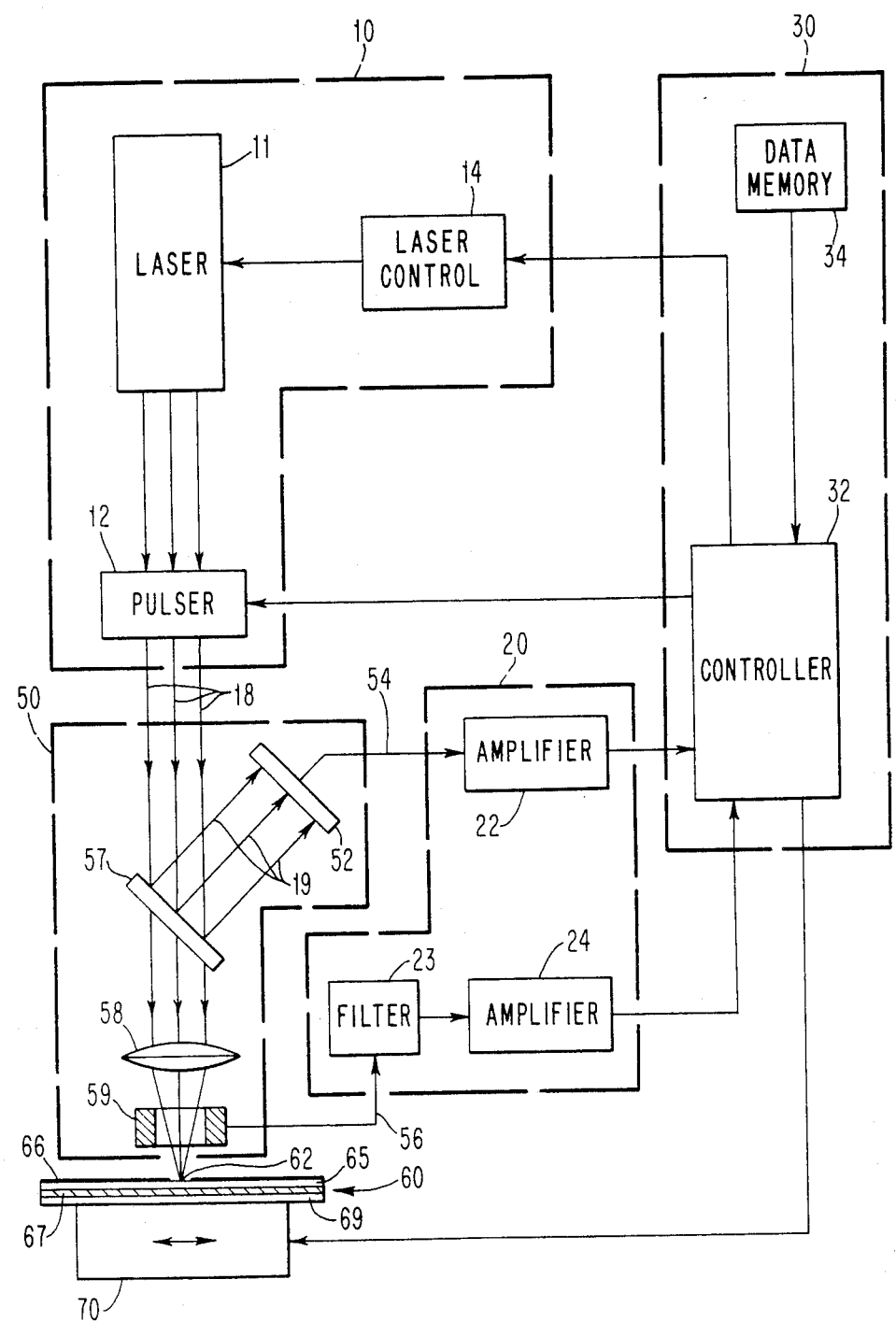

LASER DRILLING SYSTEM UTILIZING PHOTOACOUSTIC FEEDBACK

TECHNICAL FIELD

The present invention relates generally to a laser drilling system, and more particularly to a laser drilling control system utilizing photoacoustic feedback.

BACKGROUND ART

The use of a beam of radiant energy, for example, a beam of light from a pulsed, a Q-switched, or a continuous wave laser in the machining of a workpiece is known. Laser machining, such as drilling a hole on a workpiece, offers several advantages over more conventional machining techniques such as the use of a rotating drill bit, or other mechanical device. One outstanding advantage stems from the fact that the coherent radiant energy beam for a laser can be focused to an extremely fine point and, therefor, machining, more specifically, the drilling of a workpiece can be performed with a much higher degree of accuracy and resolution than is possible with the use of conventional techniques.

Some prior machining systems employ a laser. For instance, U.S. Pat. No. 3,700,850 entitled "Methods for Detecting the Amount of Material Removed by a Laser", and issued to R. M. Lumley, et al, discloses a numerically-controlled machining system, wherein the amount of material removed after each laser pulse is monitored by measuring the time taken for the shock waves generated by the laser pulse to traverse the remaining portion of the workpiece.

The principle and practice of solid state photoacoustic spectroscopy (PAS) for analyzing a given solid are also known to one skilled in that art. In PAS light energy is first absorbed by a solid, converted into an acoustic signal which is characteristic of that solid, and then converted into an electrical signal for analysis purpose. Typically, a laser is employed to provide a modulating light beam directed at a solid material to be analyzed. It is known that the solid material absorbs the modulating light beam in a way characteristic of the particular solid material. Any light absorbed by the solid material is converted, in part, or in whole into heat by non-radiative deexcitation processes within the solid. The primary source of the acoustic signal arises from the periodic time dependent heat flow from the solid to the surrounding gas. This time dependent periodic heat flow causes an oscillatory time dependent pressure in a small volume of gas at the solid-gas interface. An additional source of time dependent pressure in the gas can arise when the absorbing solid ablates and subsequently burns to release its heat of combustion in the form of heat. It is this motion of the gas which produces the acoustic signal that is characteristic of the solid (herein referred to as the photoacoustic characteristics of the solid). This acoustic signal is typically detected by a microphone and is subsequently processed. The solid material is then analyzed by examining its PAS signature. A more detailed analysis is beyond the scope here, and is, for instance, described in a book entitled "Optoacoustic Spectroscopy and Detection", edited by Y. H. Pao, Academic Press (1977).

Laser drilling has been employed to a variety of workpieces including printed circuit boards. A major concern in laser drilling of via hole sites in a multilayered printed circuit board is the lack of a real-time control system which permits the adjustment of the laser parameters to the specific conditions of the via hole site being drilled. As a result of the lack of a satisfactory real-time control system for laser drilling, abnormal operation of the laser may cause undetected drilling failures. Control of the drilling penetration is difficult to achieve since drilling by employing a laser is a non-tactile operation and there are no satisfactory methods to monitor the progress of the laser drilling process. The laser beam may be drilling through a composite layer each of which may be made of entirely different, or similar materials. Each composite layer of such a multilayered printed circuit board may have entirely different optical and absorption characteristics. In order to achieve a satisfactorily drilled hole through such a multilayered structure, different critical laser drilling parameters, such as pulse power, and pulse duration, may be required at each layer level of the composite printed circuit board. Furthermore, an undetected misregistration of the laser beam with the via hole site may lead to an improperly sited hole rendering the entire circuit board defective.

DISCLOSURE OF THE INVENTION

It is a principal object of this invention to provide an improved controlled system utilizing photoacoustic signals to monitor and control laser drilling.

It is another principal object of the present invention to provide an improved real-time control system for optimum laser drilling, wherein the laser parameters such as pulse duration and pulse power can be adjusted for each successive layer of a multilayered structure being drilled.

It is another object of the present invention to provide a real-time control system utilizing a laser with photoacoustic signals feedback for optimum drilling of via hole sites on a multilayered printed circuit board.

It is also an object of the present invention to provide an improved control system for laser drilling, wherein a misregistration of the laser beam with the drill site can be sensed thereby avoiding an improperly drilled hole which may render the multilayered structure defective.

These and other objects of the present invention can be achieved by way of a system for drilling a workpiece having at least a first layer disposed upon a second layer, comprising: a controllable radiant energy source directing a beam of radiant energy to a position on the first layer of the workpiece for drilling at the position; the first layer of the workpiece having a first photoacoustic characteristics, the second layer of workpiece having a second photoacoustic characteristics; means for detecting and discriminating the photoacoustic signal generated when the beam of radiant energy is incident upon the position, and produces an output; the photoacoustic signal being dependent upon the photoacoustic characteristics of the particular layer being drilled upon at the position; and control means for receiving the output from the detecting and discriminating means to control the radiant energy source such that the radiant energy source directs the beam of radiant energy having a first radiant characteristics to the first layer, and switches the beam of radiant energy to a second radiant characteristics upon reaching the second layer at the position of the workpiece.

Alternatively, other objects of the present invention can be achieved by a system for drilling a workpiece having at least a first layer comprising: a controllable radiant energy source directing a beam of radiant energy to a position on said first layer of said workpiece for drilling at said position; said first layer of said workpiece having a first photoacoustic characteristics, means for detecting and discriminating the photoacoustic signal generated when said beam of radiant energy incidents upon said position, and producing an output; said photoacoustic signal being dependent upon the photoacoustic characteristics of the layer being drilled upon at said position; and control means for receiving said output from said detecting and discriminating means to control said radiant energy source, such that said radiant energy source directs said beam of radiant energy having a first radiant characteristics to said first layer, and switches said beam of radiant energy to a second radiant characteristics upon sensing a change in said photoacoustic signal when drilling at said position of said workpiece.

The nature, principle and utility of the present invention will be better understood from the hereinafter detailed description of the invention, when read in conjunction with the accompanying drawings.

BRIEF DESCRIPTION OF THE DRAWING

The details of the invention will be described in conjunction with the accompanying drawing, in which:

The FIGURE is a schematic diagram of a laser drilling system utilizing photoacoustic feedback according to the present invention.

BEST MODE FOR CARRYING OUT THE INVENTION

As illustrated in the FIGURE, a preferred embodiment of the laser drilling system employing photoacoustic feedback according to the present invention includes a laser system 10, a beam focusing and photoacoustic sensing (BFPS) subsystem 50, a signal discriminating subsystem 20, and an on-line control system 30. A workpiece 60 is placed on a X-Y moving table 70. A selected via hole drill site 62 is properly positioned by the X-Y moving table 70 which is under the control of control system 30.

Laser system 10 includes a controllable laser 11, which produces a laser pulse 18 of a given radiant characteristics when an appropriate set of inputs are received by both pulser 12 and laser control 14. Controllable laser 11 can be, for instance, a Nd/YAG laser having a wavelength of about 1.06 $\mu$m and with a variable energy typically on the order of about 1 J and a pulse duration ranging from 100 $\mu$s to 5 ms in discrete steps. Other types of lasers, such as a $CO_2$ laser with suitable characteristics, can be employed.

The BFPS subsystem 50 includes lens 58 which focuses the laser pulse 18 on selected drill site 62 of workpiece 60. Sensor 59 which is in proximity to selected site 62, receives the photoacoustic signals which are generated as a result of the drilling process at selected site 62. The sensor 59 can be, for instance, a modified cardioid electric microphone with output impedance of 6000 Ohms and a sensitivity of 73 dB (0 dB=1V/$\mu$ bar at 1 KHz). The received photoacoustic signals are transformed by sensor 59 as electrical signal b for subsequent processing by filter 23 and amplifer 24, both of which are part of the signal discriminating subsystem 20. Laser beam 18 is also sampled by beam splitter 57 and a portion 19 is received by sensor 52. The sampled beam 18 is transformed into signal a on line 54 for subsequent processing by amplifer 22 which also is part of the signal discriminating of system 20.

A major concern in laser drilling of via hole site 62 on workpiece 60, such as a multilayered printed circuit board, is the lack of a real-time control system which permits the adjustment of the laser parameters to the specific conditions of the via hole site 62 being drilled. Such a multilayered printed circuit board 60 is known to exhibit cracks and/or delamination of the layers arising during and after drilling of holes through one or more layers for electrical connections. Cracks and/or delamination of the layers arise during laser drilling through the layer possibly because of overheating of the layer.

The present invention circumvents this concern, more specifically, the laser drilling system utilizing photoacoustic feedback is based on the acquisition and utilization preferably of two types of information being collected continually on-line by the BFPS subsystem 50 during the laser drilling of via hole site 62.

A first type of information, called signal a on line 54 of BFPS subsystem 50, while preferred is not necessary, characterizes the laser pulse 18 delivered to the drill site 62 on the workpiece 60. The laser pulse 18 is characterized with respect to its peak pulse power, pulse width, and pulse energy. Such signal a can be collected with a fast sensor 52 for infrared radiation such as, for example, a pyroelectric detector or a metal film detector. Signal a can be acquired by sampling the laser pulse 18 utilizing the beam splitter 57 to reflect a small fixed portion of the incoming beam 18, and to direct this sampled pulse 19 onto the sensor 52 for acquisition and subsequent processing.

A second type of information, called signal b on line 56 of the BFPS subsystem 50, and in the form of photoacoustic signals, comes from the laser drilling action itself. These photoacoustic signals are picked up with a suitable sensor 59, such as a piezoelectric sensor, or a microphone of the type described hereinabove placed in proximity to the drill site 62. The workpiece 60, such as a multilayered printed circuit board may have at least a first epoxy-glass layer 65 and a second copper layer 67 having a first and a second photoacoustic characteristics, respectively. Layer 69 may be, for instance, another epoxy-glass layer, while layer 66 may be another metal layer.

It is known that a solid material absorbs the modulating light beam 18 and produces a photoacoustic signature characteristic of the particular solid material (herein referred to as the photoacoustic characteristics of the material). Any light absorbed by the solid material is converted, in part, or in whole into heat by nonradiative deexcitation processes within the solid. The primary source of the photoacoustic signal arises from the periodic time dependent heat flow from the solid to the surrounding gas. This time dependent periodic heat flow causes an oscillatory time dependent pressure in a small volume of gas at the solid-gas interface. An additional source of time dependent pressure in the gas can arise when the absorbing solid ablates and subsequently burns to release its heat of combustion in the form of heat. it is this motion of the gas which produces the PAS signature that is characteristic of the solid. This photoacoustic signal is detected by the acoustic sensor 52 such as a microphone and is subsequently processed. The solid material is then analyzed or identified by examining its PAS signature.

According to the teaching of the present invention, as the drilling at the site 62 progresses, the characteristics of the signal b received on line 56 changes reflecting the different photoacoustic characteristics of the different layers 65, 66, 67 or 69 of the multilayered printed circuit board 60. This photoacoustic signal is fed back for optimal controlled laser drilling of each of the individual layers 65, 66, 67 and 69 as described in detail below.

Both signal a and photoacoustic signal, signal b, which contains signature characteristics information of the material layer being drilled at selected site 62, are processed by the signal discriminating subsystem 20. More specifically, photoacoustic signal, signal b, is enhanced by filter 23 to improve its signal to noise ratio, and is further amplified by amplifer circuitry 24. Since signal a is relatively noise free, no filtering is required.

Accordingly, signal a need only be enhanced by amplifer 22. The on-line control system 30, more specifically, controller 32 analyzes signal a with signal b, in conjunction with the appropriate prior stored digital data (more details of which are described hereinafter) in data memory 34, which is a part of the on-line control system 30. Depending on the outcome of this analysis, a decision is made by the controller 32 on how best to continue the hole drilling by properly selecting the laser pulse parameters by way of laser control 14 and pulser 12. All the element, i.e. filter 23, amplifers 22 and 24, of the signal discriminating subsystem 20, as well as the on-line control system 30, are conventional, and their designs, given the detailed teaching in accordance with the present invention, are well within one of ordinary skill in the art of analog and digital data acquisition and processing.

In a typical drilling operation, under the regulation of controller 32, the laser system 10 emits a laser beam 18 which is modulated by pulser 12. The characteristics of laser beam 18 is dampled by beam splitter 57 which reflects a small fixed fraction 19 of the incoming beam 18 and directs it onto sensor 52 to produce signal a as described hereinabove. While a small fraction of the beam is reflected by beam splitter 57, laser beam 18 passes substantially in its entirety through the beam splitter 57, and is focused by lens 58 onto drill site 62 on the multilayered printed circuit board 60 for drilling purposes. To illustrate laser drilling utilizing photoacoustic feedback according to the preferred embodiment of the present invention, the drilling of a hole through the epoxy-glass layer 65 reaching the copper layer 67 on site 62 of workpiece 60 is described next.

Before describing a typical drilling operation, it should be noted that the photoacoustic characteristics of copper layer 67 is distinctly different from that of epoxy-glass layer 65. Typically, copper layer 67 is characterized by its high optical reflectivity in the infrared region, its high thermal conductivity and low vapor pressure. As a result, the photoacoustic signal generated by the copper layer 67 tends to have a relatively low amplitude and decays rather rapidly (when compared to that of epoxy-glass layer 65). In contrast epoxy-glass layer 65 has a high optical absorption characteristics in the infrared region, a low thermal conductivity and a low dissociation temperature. As a result, epoxy-glass is heated to a higher temperature, vaporizes and, under appropriate conditions, the epoxy combusts in $O_2$ to yield a high heat of combustion. The photoacoustic signal generated by the epoxy-glass layer 65 tends to be of relatively high amplitude when compared to that of the copper layer 67.

Laser drilling of such a hole on selected site 62 begins with the delivery of a first sequence of pulses 18 of known radiant characteristics onto epoxy-glass layer 65. This is accomplished by controller 32 selecting the proper inputs to both laser control 14 and pulser 12 thereby selecting a known set of laser parameters, i.e. pulse power, pulse duration and pulse energy, etc. This first sequence of pulses 18 can be considered to be a probing pulse, and its characteristics can be measured and verified from analyzing signal a.

The effectiveness of this first sequence of pulses 18 on hole drilling is monitored on-line by observing the photoacoustic feedback signal, signal b. This can be accomplished by comparing signal b with a set of prior recorded signals b for the epoxy-glass layer 65 collected under normal operating conditions and cataloged for this purpose in data memory 34.

Signals a and b and the stored digital data representing a standard situation stored in data memory 34 are inputs to controller 32 having suitable logic and memory, and depending upon the outcome of the comparison of the signals a, b with the stored data, a decision on how best to continue the hole drilling is reached and a second sequence of laser pulses 18 having a second radiant characteristics is selected.

The proper delivery of this second sequence of pulses 18 can be verified from the new signal a. Its effect on hole drilling gives rise to a new photoacoustic feedback signal b that again can be compared with a known stored digital data representing a standard situation, and an updated decision on how to proceed with drilling the hole on site 62 can be reached.

This process can be repeated until, for instance, a signal b corresponding to the photoacoustic characteristics of the copper layer 67 is generated indicating a satisfactorily drilled hole through the first epoxy-glass layer 65 reaching the copper layer 67 is accomplished. When this occurs, signal b in essence indicates the end of drilling, and that laser beam 18 may be turned off. Therefore, accurate monitoring of the laser drilling in accordance with the teaching of the present invention provides a real-time end point detector thereby prevents an underdrilling, overdrilling or overheating of underlying layers and associated damage.

Alternatively, photoacoustic feedback signal, signal b, received by controller 32 may be outside of its expected range when compared to its corresponding stored standard in data memory 34. This condition may indicate an error or a defect of the workpiece 60. The laser drilling system utilizing photoacoustic feedback according to the teaching of the present invention makes possible the real-time detection of such a condition, and an early investigation of the problem so that a remedy of the problem can be provided for before such problems are compounded and become costly.

Completed drill hole at site 62 can also be inspected in situ according to the teaching of the present invention. A non-destructive laser pulse 18 can be directed to the completed drill hole at site 62. The received photoacoustic feedback signal b containing the signature information can then be analyzed to determine whether the drilling reaches the appropriate depth or the desired particular layer. Furthermore, photoacoustic feedback signal b generated as a result of the drilling of each workpiece 60 can be collected and stored for subsequent analysis of the workpiece 60, and for providing an updated standard for the data memory 34 for future drilling operation.

While the above illustration depicts a hole drilling through a single layer 65, it is clear that a uniform hole through multiple distinct and dissimilar layers 65, 67 and 69, etc. can be accomplished by tailoring, utilizing photoacoustic feedback, the laser parameters such as pulse duration, pulse power and pulse energy for each successive layers 65, 67 and 69, etc. of the selected drill site 62 on the multilayered printed circuit board 60.

Although the present invention is described in the above illustration in conjunction with a multilayered printed circuit board, other type of workpiece 60 such as a single layer board 60 is clearly within the scope of the instant invention. The single layer board 60 is a special case of a multilayered board 60, i.e. one solid layer and having all other layers being air. The above-described drilling process, for instance, can be repeated until a signal b corresponding to the photoacoustic characteristics of air is generated indicating a satisfactorily drilled through hole is made on the single layer workpiece 60.

According to another aspect of the present invention, the first laser pulse 18 need not be a pulse for drilling. It could be a relatively low energy probing pulse 18. Such a probing pulse 18 may be utilized to check the misregistration of the selected via hole site 62. If the laser 11 is positioned in registration with the selected via hole site 62, the photoacoustic signal b would reflect the photoacoustic characteristics of the epoxy-glass layer 65. On the other hand, an unintended misregistration of the laser 11 with the selected via hole site 62 would generate a photoacoustic feedback signal b reflecting in part the photoacoustic characteristics of the neighboring top metallic layer 66. According to the teaching of the present invention, when the latter condition occurs, the misregistration condition can be sensed by monitoring the photoacoustic feedback signal b, and thereby avoiding an improperly drilled hole which may render the multilayered printed circuit board 60 defective.

From the preceeding detailed description of Applicants' invention, it can be seen that laser drilling systems incorporating photoacoustic feedback have advantages heretofore not possible to achieve. In addition to the variations and modifications of Applicants' disclosed apparatus which have been suggested, many other variations and modifications will be apparent to those skilled in the art, and accordingly, the scope of Applicants' invention is not to be construed to be limited to the particular embodiments shown or suggested.

We claim:

1. A misregistration detector for aligning a controllable radiant energy source to a selected drill site which is made of a first material, and said drill site being surrounded by a second material, comprising:
   said controllable radiant energy source being adapted for directing a beam of radiant energy to said selected drill site;
   said first material having a first photoacoustic signature signal,
   said second material having a second photoacoustic signature signal;
   means for sensing and detecting and discriminating the photoacoustic signature signal generated when said beam of radiant energy is incident upon said selected drill site;
   said photoacoustic signature signal being dependent upon the photoacoustic characteristics of the particular material to which said beam of radiant energy is being directed; and
   said detecting and discriminating means producing an output upon receiving a photoacoustic signature signal containing other than said first photoacoustic signature signal,
   whereby said system is adapted to sense a misalignment of said controllable radiant energy source with said selected drill site.

2. A misregistration detector as set forth in claim 1, wherein said controllable radiant energy source is a controllable laser emitting a sequence of pulses.

3. A misregistration detector as set forth in claim 2, wherein said detecting and discriminating means includes an acoustic sensor placed in proximity to said selected drill site for sensing said photoacoustic signal.

4. A misregistration detector as set forth in claim 3, wherein said detecting and discriminating means includes the use of a digital processor.

5. A misregistration detector as set forth in claim 4, wherein said digital processor includes a data memory containing standard photoacoustic signals for comparision with said photoacoustic signal generated when said beam of radiant energy incident upon said selected drill site.

6. A misregistration detector as set forth in claim 5, wherein said selected drill site is a via hole site on a multilayered printed circuit board.

7. A misregistration detector as set forth in claim 6, wherein said first material is non-metallic and said second material is metallic.

8. A misregistration detector as set forth in claim 7, wherein said non-metallic material is epoxy-glass and said metallic material is copper.

9. A system for drilling a workpiece having at least a substrate and a first layer on the surface of said substrate, comprising
   a controllable radiant energy source for directing a beam of radiant energy at a site on said first layer of said workpiece having a first photoacoustic signature, said source having a controllable input for varying its energy level as a function of a control signal received thereby;
   means for sensing a photoacoustic signal generated photoacoustically when said beam of radiant energy is incident upon said site on said substrate, said means for sensing producing an output in response to photoacoustic signals received thereby;
   control system means for controlling said radiant energy source including controller means having an input connected to said output of said means for sensing,
   said controller means having an output connected to the controllable input of said radiant energy source for supplying said control signal thereto, and
   data memory means for containing standard photoacoustic signature signals associated with a number of different materials adapted for comparison with photoacoustic signature signals of materials to be identified, said signature signals from materials to be identified being received from said means for sensing;
   said controller means comparing said photoacoustic signature signals from said sensor and said photoacoustic signature signals from said memory means for identifying the predetermined energy level to be employed by said source of energy for a given signature and thereby sending a predetermined signal to said radiant energy source to produce said energy level from said source.

10. A system in accordance with claim 9 wherein said system includes in said memory means a photoacoustic signature signal for each of the layers of a multilayer deposit on said substrate whereby said controller means switches said beam of radiant energy to a different positive energy level in response to identification of the corresponding photoacoustic signature of each layer of said deposit as recorded by said memory means.

11. A system in accordance with claim 9 wherein said predetermined energy level comprises a beam of low energy and insufficient to effect drilling at said site, whereby drilling is terminated.

12. A system in accordance with claim 9 wherein said radiant energy source is a controllable laser emitting a sequence of pulses.

13. A system in accordance with claim 9 wherein said signatures include signatures for a multilayered printed circuit board.

14. A system in accordance with claim 9 wherein said signatures include signatures for a nonmetallic layer and a metallic layer.

15. A system in accordance with claim 9 wherein said signatures include signatures for epoxy glass and copper layers respectively.

16. A system in accordance with claim 9 wherein said system includes in said memory means a photoacoustic signature signal for each of the material of a drill site and a surrounding second material, whereby said controller means signals the photoacoustic signature of said second material, whereby a misalignment of said controllable radiant source with said drill site can be sensed.

* * * * *